Feb. 3, 1959 A. H. DICKINSON 2,872,570

ELECTRONIC AMPLIFIER

Filed Aug. 3, 1950

INVENTOR
ARTHUR H. DICKINSON
BY John R. Shipman
ATTORNEY

United States Patent Office 2,872,570

Patented Feb. 3, 1959

2,872,570

ELECTRONIC AMPLIFIER

Arthur H. Dickinson, Greenwich, Conn., assignor to International Business Machines Corporation, New York, N. Y., a corporation of New York Application August 3, 1950, Serial No. 177,447

26 Claims. (Cl. 250—27)

This invention relates to an electronic amplifier employing a semiconductor translating device and to such an amplifier arranged as a trigger circuit.

A semiconductor triode, called a "transistor," and its arrangement in an amplifier circuit have been described in articles by Bardeen and Brattain in The Physical Review 75, 1208—April 1949, and by Becker and Shive in Electrical Engineering 68, 215—March 1949. This prior amplifier circuit comprises a semiconductor translating device including a semiconductor having emitter, collector and base connections and a source of direct current voltage, with the collector connected through a load resistor to the negative terminal of the voltage source, the base connected to an intermediate terminal and the emitter connected through an input signal source to the positive terminal. Because of the characteristics of this type of translating device, variations in current through the emitter cause corresponding but greater variations in current through the collector. Consequently, a change in the signal voltage, producing a corresponding change in the emitter current, results in a change in the collector current which is larger than the emitter current change.

In my copending application Serial No. 177,446 filed on August 3, 1950, there is described a semiconductor translating device amplifier circuit which incorporates an impedance element, such as a vacuum tube, through which a substantial portion of the emitter current passes. The impedance of the tube is then varied in accordance with the input signal to control the magnitude of the emitter current and thereby, through the action of the transistor, vary the collector current. The specific circuits illustrated in the copending application include a vacuum tube connected in the base lead of a semiconductor translating device, which includes a semiconductor having emitter, collector and base connections, to conduct current from the base, with the grid of the tube responsive to the input signal to vary the tube conductivity.

It is indicated in the aforesaid copending application that a semiconductor translating device including a semiconductor having emitter, collector and base connections is especially suitable. In such a translating device current may flow with a low impedance through the emitter into the semiconductor but the output current from the semiconductor through the collector normally encounters a relatively high impedance. This impedance is provided by an electrical barrier through which it is difficult for current carriers of the sign of the carriers normally present in the semiconductor to pass toward the collector. Such barrier may be formed by employing a point contact, rectifying, collector connection to the semiconductor or in various other suitable ways. Current flowing into the semiconductor through the emitter introduces into the semiconductor current carriers of a sign opposite to that of the carriers normally present therein. The current carriers so introduced are effective to reduce the impedance offered to current flowing out through the collector. The greater the number of carriers of opposite sign introduced, the lower the impedance becomes and the collector current varies with the emitter current. The base connection provides a low impedance path for current therethrough into or out of the semiconductor.

There is also described in my copending application an arrangement of my above-described amplifier as a bistable positive feedback amplifier with a gain greater than one to form a trigger circuit. The specific trigger circuits illustrated therein also incorporate the vacuum tube connected in the base lead of the translating device with the control grid connected to a resistor in the collector lead to provide the positive feedback.

It is an object of my invention to provide a novel amplifier of the general type disclosed in my copending application and employing a semiconductor translating device.

Another object of my invention is to provide a novel amplifier employing a semiconductor translating device and providing a low impedance output without phase reversal.

Still another object of my invention is to provide a new and improved semiconductor translating device amplifier of the cathode follower type.

A further object of my invention is to provide a new and improved semiconductor translating device amplifier of the cathode follower type having a gain greater than unity.

It is also an object of my invention to provide a novel amplifier employing a semiconductor translating device and arranged as a trigger circuit.

Another object of my invention is to provide a new semiconductor translating device amplifier of the cathode follower type arranged as a trigger circuit.

It is another object of my invention to provide a novel bi-stable amplifier of the cathode follower type having a positive feedback with a gain greater than unity.

In accordance with my present invention I provide an amplifier in which the emitter and base of a semiconductor translating device are connected in a circuit across a first direct current voltage supply with a variable impedance member, such as a vacuum tube, connected between the emitter and voltage supply. The collector is connected through a load resistor to the remote end of a second voltage supply in series with the first supply. The control grid of the tube is adapted to receive an input signal voltage and to vary the impedance of the tube, and thereby the current through the emitter, in accordance therewith. Such variation in the emitter current causes a corresponding variation in the collector and load resistor current through the action of the semiconductor translating device. A cathode follower effect is produced by the use of the translating device in the cathode circuit of the tube. In addition, the circuit may be adjusted to have a gain greater than unity.

Further, in accordance with my invention I provide an amplifier of the cathode follower type as just described, which in addition has a positive feedback arrangement. This arrangement forms a trigger circuit having two stable conditions between which it may be switched by the application of suitable input signals. The cathode follower effect in the trigger circuit provides a better matching in the feedback, thereby permitting greater tolerance in the selection and adjustment of the elements in the circuits.

Other objects and features of the invention will be pointed out in the following description and claims and illustrated in the accompanying drawings, which disclose, by way of example, the principle of the invention and the best mode, which has been contemplated, of applying that principle.

Figures 1, 2, 3, 4:
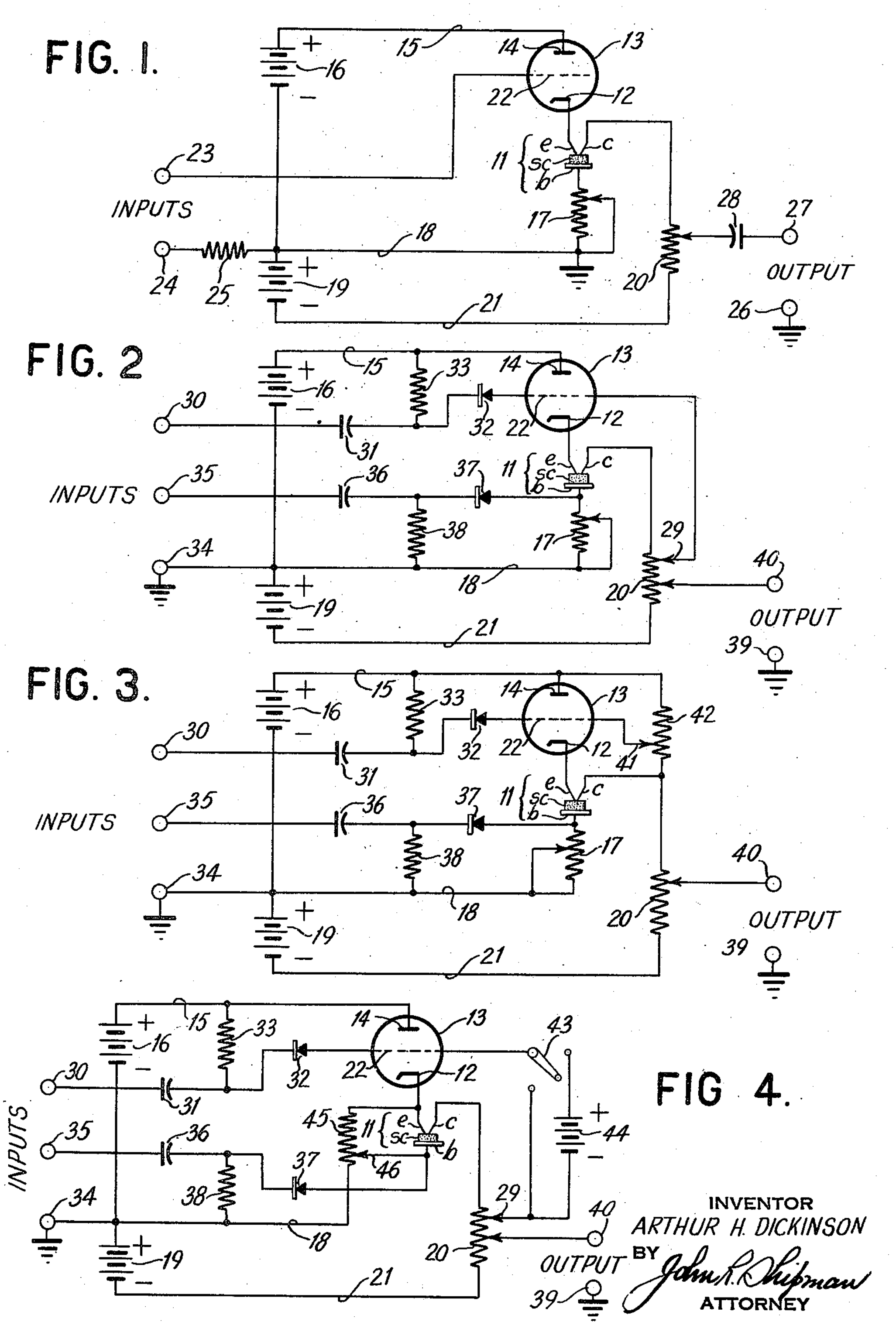
Fig. 1 is a circuit diagram of an amplifier in accordance with my invention.
Fig. 2 is a circuit diagram of an amplifier of the type shown in Fig. 1 connected to form a trigger circuit.
Figs. 3 and 4 are circuit diagrams of modifications of the trigger circuit of Fig. 2.

In the circuit of Fig. 1 there is provided a translating device 11 comprising a block of a suitable semiconductor *sc*, such as an n-type germanium crystal, having on its surface a pair of point contacts suitably located to form an emitter *e* and a collector *c*, and a large area contact forming a base *b*. The emitter *e* is connected to the cathode 12 of a vacuum tube 13, the anode 14 of which is connected to a positive direct current voltage supply line 15 shown, for purposes of illustration, as connected to the positive terminal of a voltage source such as a battery 16. The base *b* is connected through an adjustable resistor 17 to a grounded supply line 18 which is connected to the negative terminal of the battery 16 and to the positive terminal of another battery 19. The collector *c* is connected through a load resistor 20 to a negative direct current voltage supply line 21 which is shown connected to the negative terminal of the battery 19.

The grid 22 of the tube 13 is connected to an input terminal 23. An input signal voltage is adapted to be impressed between the input terminal 23 and another input terminal 24 connected through a resistor 25 to the grounded line 18. The output of the circuit appears between a grounded terminal 26 and another output terminal 27 coupled through a condenser 28 to an intermediate point on the load resistor 20.

In considering the operation of the amplifier circuit shown in Fig. 1, it is to be remembered that the characteristics of the translating device are such that variations in current through the emitter produce a corresponding variation in current through the collector. It is evident that the tube 13 controls all of the current through the emitter. It does so in accordance with voltage variations of the input signal applied between input terminals 23 and 24. As the emitter current varies under the control of tube 13, the collector current is varied accordingly to change the IR voltage drop across the load resistor 20. As a result, corresponding output voltage variations in phase with, but of greater magnitude than, the input signal appear between terminals 26 and 27.

It is to be noted that the connection of the translating device 11 and resistors 17 and 20 in the cathode circuit of the tube 13 provides a cathode follower effect. Consequently, the amplifier circuit has many of the advantages of a cathode follower in that it has a high input impedance and a low output impedance, making it particularly suitable for coupling between certain types of circuits. Although the circuit may not have as much power gain as a conventional cathode follower amplifier, it does have a greater voltage gain amplification provided through the operation of both the tube 13 and the translating device 11. The circuit can be adjusted to provide a voltage gain greater than unity and, as previously mentioned, the output is in phase with the input.

Although the use of a semiconductor of n-type germanium has been described, it will be understood by those skilled in the art that p-type germanium might be used with the voltage polarities reversed, or other suitable semi-conductors may be employed.

In Fig. 2 is shown a circuit diagram of an amplifier somewhat similar to that shown in Fig. 1 but connected as a bi-stable amplifier having a positive feedback with a gain greater than unity. Corresponding elements in the two circuits have the same reference numbers applied thereto.

The circuit of Fig. 2 differs from that of Fig. 1 only in the provision of a positive feedback and different input arrangements suitable for trigger circuit operation. The feedback is afforded by connecting the control grid 22 of tube 13 to an adjustable tap 29 on the resistor 20. There are two inputs provided, one connected to the control grid 22 of tube 13 and the other connected to the base *b* of the transistor 11.

The input arrangement for the control grid 22 extends from an input terminal 30 through a condenser 31 and a diode rectifier 32 to the control grid. A resistor 33 is connected from the junction between the condenser 31 and the rectifier 32 to the supply line 15. The condenser 31 and resistor 33 act as a differentiating circuit for input impulses to be applied between the input terminal 30 and a grounded terminal 34 while the rectifier 32 prevents positive components of the input from being applied to the grid 22.

The input arrangement for the base *b* of the translating device 11 extends from another input terminal 35 through a condenser 36 and a diode rectifier 37 to the base *b*. A resistor 38 is connected from the supply line 18 to the junction between the condenser 36 and rectifier 37. The condenser 36 and resistor 38 serve as a differentiating circuit while the rectifier 37 prevents positive components of an input signal applied between input terminals 35 and 34 from appearing at the base *b*.

The output in Fig. 2 appears between a grounded terminal 39 and terminal 40 connected to an intermediate point on resistor 20.

In considering the operation of the circuit of Fig. 2, let it be assumed that tube 13 is non-conductive. Under this condition no current flows through the emitter and current through the collector is at a minimum so that the output voltage between terminals 39 and 40 is at a minimum. The position of tap 29 is adjusted so that with minimum current flowing through the collector, the voltage level of the grid 22 of tube 13 is well below cutoff to maintain the tube non-conductive. Since the grid is well below cutoff, small changes in the collector current have no effect upon the conductivity of tube 13 and the circuit is in its first stable state.

With the circuit in its first stable state, let it now be assumed that a negative input voltage impulse is applied through terminal 35 to the base *b* of the translating device 11. It appears that such an impulse makes the cathode 12 of tube 13 much more negative so that the tube becomes conductive. Current flowing through the tube 13 flows through the emitter *e*, causing a corresponding increase in the current through the collector *c*. With the increased collector current, the voltage level of tap 29, and therefore of the grid 22, rises, causing the tube to become more and more conductive. More current through the tube increases the emitter current still further with corresponding further increases in the collector current. Thus a regenerative effect occurs which continues until, because of the well-known tube characteristics, further increases in the voltage level of the control grid do not produce substantial increases in tube current to cause any substantial increase in collector current. This is the second stable state of the trigger circuit, with current through the tube 13, the emitter *e* and the collector *c* at a maximum. In the second stable state, the output voltage is at its maximum level.

With the circuit of Fig. 2 in its second stable state, let it be assumed that a negative input voltage impulse is applied to the control grid 22 of tube 13 through the input terminal 30. Such a negative input impulse on the grid 22 causes the tube 13 to become less conductive. The resulting decrease in the emitter current causes a corresponding decrease in collector current. With the decrease in collector current, the voltage level of tap 29 is lowered, causing a further decrease in conductivity of the tube. This regenerative effect continues until the tube becomes completely non-conductive and the circuit returns to its first stable state.

It will be understood that for an input impulse to switch the circuit of Fig. 2 from one stable state to the other, the impulse must have such magnitude and form as to upset the stability of the circuit and move it into the unstable region. For example, with the circuit in its first stable state wherein the tube is non-conductive, the input impulse must be great enough to cause the tube to become conductive and produce, through the increase in collector current, sufficient increase in the grid voltage to prevent the tube from becoming non-conductive again at the end of the input impulse. Similarly, with the circuit in the second stable state in which the tube is highly conductive, the input impulse must be great enough to cause a decrease in the emitter current so that the grid voltage is lowered sufficiently that the tube will not become highly conductive again when the impulse ends. Of course, with an input pulse of sufficient magnitude and duration, switching of the trigger circuit from one state to the other may be completed before the impulse ends.

It is now evident that the circuit of Fig. 2 is a trigger circuit, having two stable conditions and that it may be switched from one stable condition to the other by appropriate input means for initiating a change in the emitter current. Such a change may be obtained as described through the application of negative input impulses at the base *b* or the grid 22 depending upon the initial stable state of the circuit. Switching of the trigger circuit alternately between its two stable states may be accomplished by applying negative input impulses alternately at the base *b* and grid 22.

It is to be noted that the connection of the translating device 11 and resistors 17 and 20 in the cathode circuit of the tube 13 provides a cathode follower effect in the trigger circuit. As previously indicated, this enables a better matching in the feedback from the resistor 20 to the tube 13 and thereby permits a greater tolerance in the selection and adjustment of elements in the circuit, particularly in the selection of a translating device.

The trigger circuit shown in Fig. 3 is the same as that of Fig. 2 with the exception that the control grid 22, instead of being connected to an adjustable tap 29 on resistor 20, is connected to an adjustable tap 41 on a resistor 42 connected between the positive voltage supply line 15 and the collector *c*. The resistors 42 and 20 then constitute a divider connected between supply lines 15 and 21 with the voltage drop across resistor 20 varying with collector current. This arrangement in effect introduces a small bias voltage in the feedback connection between resistor 20 and control grid 22 which may be useful in obtaining proper adjustment of voltage level. The operation of the trigger circuit of Fig. 3 is substantially as described for the circuit of Fig. 2.

The trigger circuit shown in Fig. 4 is similar to that shown in Fig. 2 with two exceptions. First, the control grid 22 is connected to the adjustable tap 29 on resistor 20 through a single-pole double-throw switch 43 which enables either a direct connection to tap 29 or the inclusion of a battery 44 in the feedback circuit to provide a bias voltage, if desired. Second, the resistor 17 of Fig. 2 is omitted and another resistor 45 is connected from the cathode 12 of tube 13 to the grounded supply line 18 with the base *b* of the translating device 11 being connected to an adjustable tap 46 on that resistor. This arrangement facilitates adjustment of voltage relationships and may be useful in some situations. The operation of the circuit of Fig. 4 is substantially as described for the circuit of Fig. 3.

While the translating devices specifically illustrated and described herein have been of the type comprising a semiconductor with a large area ohmic base connection and point contact, rectifying emitter and collector connections, it is to be understood that my invention is not to be restricted to the use of this specific type of translating device. In the broadest aspects of my invention the important characteristic of the translating device in the amplifier and trigger circuits is that when the translating device is suitably connected to a voltage supply, the output current from the device varies in accordance with and in the same direction as variations in the input voltage applied to the device.

In the slightly narrower aspects of my invention the translating device includes a semiconductor connected to an output circuit to provide a relatively high impedance to current flowing to the ouput circuit. This impedance as previously discussed is provided by an electrical barrier through which it is difficult for current carriers normally present in the semiconductor to pass in the direction of flow of the output current. Input circuit connections are also provided for such a device with input current therethrough introducing into the semiconductor current carriers of opposite sign to those normally present therein, which introduced carriers may more easily pass through the barrier, whereby the impedance to the output current is varied in accordance with variations in the input current.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. An amplifier comprising a translating device including a semiconductor having emitter, collector and base connections; first and second direct current voltage supplies connected in series; first circuit means connecting said emitter and base in a circuit across said first supply including a vacuum tube having an anode and cathode interposed in the circuit between said supply and said emitter, said tube having a control element for varying the impedance thereof in accordance with the voltage level of said element and adapted to receive an input signal voltage, whereby the emitter current is varied with the input signal; and second circuit means including a load resistor connecting said collector to the end of said second supply remote from the first supply.

2. An amplifier comprising a translating device including a semiconductor having emitter, collector and base connections; first and second direct current voltage supplies connected in series; first circuit means connecting said emitter and base in a circuit across said first supply; said first circuit means including a vacuum tube connected in said circuit between said first supply and emitter to conduct current which passes through the emitter; said tube having a control grid adapted to receive an input signal voltage and responsive to variations therein to vary the conductivity of the tube accordingly and thereby vary the emitter current; and second circuit means including a load resistor connecting said collector to the end of said second supply remote from the first supply.

3. A amplifier comprising a translating device including a semiconductor having emitter, collector and base connections; three direct current voltage supply lines, the second being less positive than the first and more positive than the third; first circuit means connecting the first line to said emitter and including a vacuum tube having an anode, cathode and control grid, and means connecting the said anode to the first line and said cathode to the emitter; second circuit means including a resistor connecting the second line to said base; said control grid being adapted to receive an input signal voltage and responsive to variations therein to vary the impedance of the tube accordingly and thereby vary current through the emitter; and third circuit means including a load resistor connecting the third line to said collector.

4. A trigger circuit comprising a translating device including a semiconductor having emitter, collector and base connections; three direct current voltage supply lines, the second being less positive than the first and more positive than the third; first circuit means including a variable impedance member connecting the first line to the emitter; second circuit means connecting the second line to the base; third circuit means including a resistor connecting the third line to the collector; said variable impedance member having a control element; and means coupling said control element to said resistor in a positive feedback arrangement to vary the impedance of said member, and thereby current through the emitter, directly with variations in current through the collector.

5. A trigger circuit comprising a translating device including a semiconductor having emitter, collector and base connections; three direct current voltage supply lines, the second being less positive than the first and more positive than the third; first circuit means including a variable impedance member connecting the first line to the emitter; second circuit means connecting the second line to the base; third circuit means including a resistor connecting the third line to the collector; said variable impedance member having a control element; means coupling said control element to said resistor in a positive feedback arrangement to vary the impedance of said member, and thereby current through the emitter, directly with variations in current through the collector; and input circuit means for varying momentarily the emitter current.

6. A trigger circuit comprising a translating device including a semiconductor having an emitter, collector and base; first and second direct current voltage supplies connected in series; first circuit means connecting said emitter and base in a circuit across said first supply, said first circuit means including a vacuum tube connected in said circuit between said first supply and emitter to conduct current which passes through the emitter; said tube having a control grid for varying the conductivity of the tube, and thereby the emitter current, according to the voltage level of the grid; second circuit means including a resistor connecting said collector to the end of said second supply remote from the first supply; and means coupling said control grid to said resistor in a positive feedback arrangement.

7. A trigger circuit comprising a translating device including a semiconductor having an emitter, collector and base; three direct current voltage supply lines, the second being less positive than the first and more positive than the third; a vacuum tube having an anode, cathode and control grid; means connecting said anode to the first supply line; means connecting said cathode to said emitter; means including a first resistor connecting the base to the second supply line; means including a second resistor connecting the collector to the third line; and means coupling said control grid to said second resistor to vary the conductivity of the tube, and thereby current through the emitter, directly with variations in collector current.

8. A trigger circuit comprising a translating device including a semiconductor having an emitter, collector and base; three direct current voltage supply lines, the second being less positive than the first and more positive than the third; a vacuum tube having an anode, cathode and control grid; means connecting said anode to the first supply line; means connecting said cathode to said emitter; means including a first resistor connecting the base to the second supply line; means including a second resistor connecting the collector to the third line; means coupling said control grid to said second resistor to vary the conductivity of the tube, and thereby current through the emitter, directly with variations in collector current; first input means connected to said control grid and adapted to receive a negative input voltage impulse to initiate a decrease in emitter current; and second input means connected to the base and adapted to receive a negative input voltage impulse to initiate an increase in emitter current.

9. A trigger circuit having two alternate stable states and comprising a translating device including a semiconductor having an emitter, collector and base; three direct current voltage supply lines, the second being less positive than the first and more positive than the third; a vacuum tube having an anode, cathode and control grid; means connecting said anode to the first supply line; means connecting said cathode to said emitter; means including a first resistor connecting the base to the second supply line; means including a second resistor connecting the collector to the third line; means coupling said control grid to said second resistor in a positive feedback arrangement to vary the conductivity of the tube, and thereby current through the emitter, directly with variations in collector current; whereby in the first stable state the emitter current and the collector current are at a minimum and they are at a maximum in the second stable state; first input means connected to said control grid and adapted to receive a negative input voltage impulse to initiate a decrease in emitter current and effect switching from the second to the first state; and second input means connected to the base and adapted to receive a negative input voltage impulse to initiate an increase in emitter current and effect switching from the first to the second state.

10. A trigger circuit comprising a translating device including a semiconductor having an emitter, collector and base; three direct current voltage supply lines, the second being less positive than the first and more positive than the third; a vacuum tube having an anode, cathode and control grid; means connecting said anode to the first supply line; means connecting said cathode to said emitter; means including a first resistor connecting the base to the second supply line; a voltage divider connected between said first and third lines; means connecting said collector to a first intermediate point of said divider whereby collector current flows through that portion of the divider between said first point and third line; and means connecting said control grid to a second intermediate point on said divider between said first point and first line to vary the conductivity of the tube, and thereby current through the emitter, directly with variations in collector current.

11. A trigger circuit comprising a translating device including a semiconductor having an emitter, collector and base; three direct current voltage supply lines, the second being less positive than the first and more positive than the third; a vacuum tube having an anode, cathode and control grid; means connecting said anode to the first supply line; means connecting said cathode to said emitter; a first resistor connected between said cathode and the second line, said resistor having an adjustable intermediate tap connected to said base; means including a second resistor connecting the collector to the third line; and means coupling said control grid to said second resistor to vary the conductivity of the tube, and thereby current through the emitter, directly with variations in collector current.

12. A bistable triggered circuit comprising a current-multiplication transistor including a semi-conducting body, a base electrode, an emitter electrode and a collector electrode in contact with said body, an external circuit network interconnecting said electrodes with a common junction point and including a first impedance element connected between said base electrode and said junction point, an output second impedance element connected between said collector electrode and said junction point, means serially connected with said first and second impedance elements for applying a bias voltage in the reverse direction between said collector and base electrodes, a non-linear resistance device connected between said emitter electrode and said junction point, and means connected between said emiter and base electrodes for applying a bias voltage in the forward direction between said emitter and base electrodes, said circuit thereby having a stable state of low current conduction and another stable state of high current conduction, and said device being connected so as to have a relatively high resistance while said circuit is in said state of low current conduction and to have a relatively low resistance while said circuit is in said state of high current conduction.

13. A triggered circuit as defined in claim 12 wherein said first impedance element is a resistor.

14. A triggered circuit as defined in claim 12 wherein said output second impedance element is a resistor.

15. A triggered circuit as defined in claim 12 wherein means is provided for applying trigger pulses to at least one of said electrodes.

16. A triggered circuit as defined in claim 12 wherein said non-linear resistance device is a rectifier.

17. A bistable triggered circuit comprising a current-multiplication transistor including a semi-conducting body, a base electrode, an emitter electrode and a collector electrode in contact with said body, an external network interconnecting said electrodes with a junction point and including a resistor connected between said base electrode and said junction point, an output impedance element connected between said collector electrode and said junction point, a first source of voltage serially connected with said impedance element between said collector electrode and said junction point for applying a bias voltage in the reverse direction between said collector and base electrodes, a second source of voltage serially connected with said resistor between said emitter and base electrodes for applying a bias voltage in the forward direction between said emitter and base electrodes, a rectifier connected between said emitter electrode and said junction point, said circuit thereby having a stable state of low current conduction and another stable state of high current conduction, said rectifier being poled so as to be non-conducting when said circuit is in said stable state of low current conduction and so as to be conducting when said circuit is in said stable state of high current conduction, and a pair of output terminals coupled across said impedance element.

18. A triggered circuit as defined in claim 17 wherein means are provided to apply trigger pulses of the same polarity alternately to two different ones of said electrodes.

19. A triggering circuit comprising a transistor having an emitter electrode, a collector electrode and a base electrode, means to promote sufficient regenerative feedback from said collector electrode to said emitter electrode to give rise to a region of negative resistance in the emitter current-emitter voltage characteristic of said transistor; and a circuit branch connected in a shunt relation with said emitter and base electrodes comprising in parallel a resistive circuit and a series circuit having a holding source of direct current and an asymmetrical conducting impedance element.

20. A triggering circuit comprising a transistor having an emitter electrode, a collector electrode and a base electrode, means to promote sufficient regenerative feedback from said collector electrode to said emitter electrode to give rise to a region of negative resistance in the emitter current-emitter voltage characteristic of said transistor; and a circuit branch connected in a shunt relation with said emitter and base electrodes comprising in parallel a resistive circuit and a series circuit having a holding source of direct current and an asymmetrical conducting impedance element, said asymmetrical conducting impedance element being poled for easy current flow in the direction of positive emitter current.

21. An electronic signal translating circuit comprising, a semi-conductor device including base, emitter and colletor electrodes, means connected for applying potentials to said electrodes, means for impressing trigger pulses between two of said electrodes, and a unilaterally conducting device connected between said collector and emitter electrodes to render said emitter electrode responsive to changes of the current flowing through and changes of the voltage existing at one of the other of said electrodes.

22. A bistable triggered circuit comprising a current-multiplication transistor including a semi-conducting body, a base electrode, an emitter electrode and a collector electrode in contact with said body, means for supplying operating potentials to said electrodes comprising an external circuit network interconnecting said electrodes with a common junction point and including a first impedance element connected between said base electrode and said junction point, an output second impedance element connected between said collector electrode and said junction point, and a non-linear resistance device connected between said emitter electrode and said junction point, said circuit thereby having a stable state of low current conduction and another stable state of high current conduction, and said device being connected so as to have a relatively high resistance while said circuit is in said state of low current conduction and to have a relatively low resistance while said circuit is in said state of high current conduction.

23. A flip-flop circuit comprising a transistor having emitter, collector and base electrodes, means for supplying operating potentials to said electrodes including a high impedance load-line circuit connected to said emitter electrode, providing for low-current stable operation, and a non-linear impedance load-line circuit connected to said emitter electrode, providing for high-current stable operation, said high impedance load-line circuit and said non-linear impedance load-line circuit being connected in parallel to said emitter electrode, and gating means controlling the operation of said load-line circuits.

24. A circuit arrangement comprising an electron discharge device having cathode, grid and anode electrodes, a transistor having emitter, collector and base electrodes, means coupling said emitter electrode directly to said cathode, a resistance element, means for supplying operating potentials to said electrodes including means connecting said base electrode to said resistance element to connect said base electrode, said resistance element and the anode-cathode path of said device in a common current path, and means for applying an input signal to said grid electrode to control the amplitude of the current flow through said device and said transistor.

25. A circuit arrangement comprising an electron discharge device having cathode, grid and anode electrodes, a transistor having emitter, collector and base electrodes, means coupling said emitter electrode directly to said cathode, means for supplying operating potentials to said electrodes, including means connecting said base electrode and the anode-cathode path of said device in a common current path, and means for applying an input signal to said grid electrode to control the amplitude of the current flow through said device and said transistor.

26. A bistable trigger circuit which has a low-current and a high-current quiescent position comprising a transistor device having a plurality of electrodes; a resistor connected to one of said electrodes; a biasing circuit arrangement connected to all of said electrodes; and a holding circuit connected to said one electrode having an asymmetrically conducting impedance device and a holding source.

References Cited in the file of this patent

UNITED STATES PATENTS

| | | |
|---|---|---|
| 2,006,872 | Nyman | July 2, 1935 |
| 2,404,919 | Overbeck | July 30, 1946 |
| 2,494,865 | Fleming-Williams et al. | Jan. 17, 1950 |
| 2,517,960 | Barney et al. | Aug. 8, 1950 |
| 2,524,035 | Bardeen et al. | Oct. 3, 1950 |
| 2,533,001 | Eberhard | Dec. 5, 1950 |
| 2,569,347 | Schockley | Sept. 25, 1951 |
| 2,585,078 | Barney | Feb. 12, 1952 |